US012619065B2

(12) United States Patent
Carminati et al.

(10) Patent No.: US 12,619,065 B2
(45) Date of Patent: May 5, 2026

(54) PROCESS FOR MANUFACTURING A MICROELECTROMECHANICAL MIRROR DEVICE AND MICROELECTROMECHANICAL MIRROR DEVICE

(71) Applicant: STMicroelectronics S.r.l., Agrate Brianza (IT)

(72) Inventors: Roberto Carminati, Piancogno (IT); Nicolo' Boni, Mountain View, CA (US); Irene Martini, Bergamo (IT); Massimiliano Merli, Stradella (IT); Laura Oggioni, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 810 days.

(21) Appl. No.: 17/729,558

(22) Filed: Apr. 26, 2022

(65) Prior Publication Data

US 2022/0350134 A1     Nov. 3, 2022

(30) Foreign Application Priority Data

Apr. 30, 2021     (IT) ........................ 102021000011039

(51) Int. Cl.
  B81B 7/02     (2006.01)
  B81C 1/00     (2006.01)
  (Continued)

(52) U.S. Cl.
  CPC ............ G02B 26/0858 (2013.01); B81B 7/02 (2013.01); B81C 1/00428 (2013.01);
  (Continued)

(58) Field of Classification Search
  CPC ............ G02B 26/0858; G02B 26/0833; G02B 6/3556; B81B 2201/042; B81B 3/0083;
  (Continued)

(56) References Cited

U.S. PATENT DOCUMENTS

2014/0071507 A1* 3/2014 Aimono ............ G02B 26/0858
                                                             359/199.4
2021/0149025 A1* 5/2021 Konishi ............ G02B 26/0858

FOREIGN PATENT DOCUMENTS

CN         1836324 A     9/2006
CN         1969217 A     5/2007
        (Continued)

OTHER PUBLICATIONS

IT Search Report and Written Opinion for priority application, IT 102021000011039, report dated Jan. 13, 2022, 7 pgs.
(Continued)

*Primary Examiner* — Moazzam Hossain
(74) *Attorney, Agent, or Firm* — Crowe & Dunlevy LLC

(57) ABSTRACT
A process for manufacturing a microelectromechanical mirror device includes, in a semiconductor wafer, defining a support frame, a plate connected to the support frame so as to be orientable around at least one rotation axis, and cantilever structures extending from the support frame and coupled to the plate so that bending of the cantilever structures causes rotations of the plate around the at least one rotation axis. The process further includes forming piezoelectric actuators on the cantilever structures, forming pads on the support frame, and forming spacer structures protruding from the support frame more than both the pads and the stacks of layers forming the piezoelectric actuators.

15 Claims, 9 Drawing Sheets

(51) Int. Cl.
    *G02B 26/08*       (2006.01)
    *H10H 20/84*       (2025.01)
    *H10N 30/20*       (2023.01)

(52) U.S. Cl.
    CPC ......... *B81C 1/00492* (2013.01); *H10H 20/84*
        (2025.01); *H10N 30/2042* (2023.02); *B81B*
            *2201/032* (2013.01); *B81B 2201/042*
            (2013.01); *B81C 2201/0198* (2013.01)

(58) Field of Classification Search
    CPC .......... B81B 2201/04; B81B 2201/032; H10N
               30/2042; H04N 5/7458
    See application file for complete search history.

(56) References Cited

FOREIGN PATENT DOCUMENTS

| | | | |
|---|---|---|---|
| CN | 104865698 | A | 8/2015 |
| CN | 105637405 | A | 6/2016 |
| CN | 107250033 | A | 10/2017 |
| CN | 107664836 | A | 2/2018 |
| CN | 108249387 | A | 7/2018 |
| CN | 108345105 | A | 7/2018 |
| CN | 109613695 | A | 4/2019 |
| CN | 111320129 | A | 6/2020 |
| CN | 218413054 | U | 1/2023 |
| EP | 3666727 | A1 | 6/2020 |
| JP | 2001266740 | A | 9/2001 |
| JP | 2006189573 | A | 7/2006 |
| WO | WO-2010113602 | A1 * | 10/2010 ......... H10N 30/2043 |
| WO | 2016134329 | A1 | 8/2016 |

OTHER PUBLICATIONS

CN Office Action 1 and Search Report for counterpart CN Appl. No. 202210472853.X, report dated Jul. 10, 2025, 7 pgs.

3rd CN Office Action and Search Report for counterpart CN Appl. No. 202210472853.X, report dated Mar. 12, 2026, 10 pgs.

* cited by examiner

PROCESS FOR MANUFACTURING A MICROELECTROMECHANICAL MIRROR DEVICE AND MICROELECTROMECHANICAL MIRROR DEVICE

PRIORITY CLAIM

This application claims the priority benefit of Italian Application for Patent No. 102021000011039, filed on Apr. 30, 2021, the content of which is hereby incorporated by reference in its entirety to the maximum extent allowable by law.

TECHNICAL FIELD

This disclosure relates to a process for manufacturing a microelectromechanical mirror device and the microelectromechanical mirror device so manufactured.

BACKGROUND

As is known, the so-called shadow mask technique is widely used in the manufacture of microelectromechanical micro-mirror devices and is particularly appreciated for its simplicity of execution and for the high reflectivity values that may be obtained. The technique is applied in the final manufacturing steps, after support structures and actuation structures, normally of a piezoelectric type, have been defined in a semiconductor wafer and metallization and passivation layers have been deposited and shaped.

Basically, a mask, specifically called a "shadow" mask, is formed separately from the semiconductor wafer and has openings corresponding in shape and arrangement to the micro-mirrors to be formed. The shadow mask is aligned and applied to the wafer being processed, then micro-mirrors are formed through the openings in the shadow mask itself using a sputtering deposition process to deposit, for example, gold/aluminum.

A frequent problem occurs when the shadow mask is applied to the semiconductor wafer for depositing the micro-mirrors or when the mask itself is subsequently removed. The wafer being processed has prominent structures having the shadow mask resting thereon. The most prominent parts are usually stacks of layers corresponding to the contacts of the piezoelectric actuation structures and therefore perform a critical function for the operation of the micro-mirror device. When the shadow mask is applied and removed, some of the structures in contact may be damaged relatively easily, compromising the functionality of the entire device. Consequently, the yield of the manufacturing process may not be satisfactory.

As such, further development into manufacturing techniques in this area is desired.

There is a need in the art to provide a process for manufacturing a microelectromechanical mirror device and the microelectromechanical mirror device so manufactured that allow the described limitations to be overcome or at least mitigated.

SUMMARY

In an embodiment, method for manufacturing a microelectromechanical mirror device comprises: in a semiconductor wafer, defining a support frame, a plate connected to the support frame so as to be orientable around at least one rotation axis, and cantilever structures extending from the support frame and coupled to the plate so that bending of the cantilever structures causes rotation of the plate around the at least one rotation axis; forming piezoelectric actuators on the cantilever structures; forming pads on the support frame; and forming spacer structures protruding from the support frame more than both the pads and stacks of layers forming the piezoelectric actuator.

The method may also include: applying a shadow mask to the spacer structures; forming a micro-mirror on the plate using the shadow mask; and removing the shadow mask.

The spacer structures may protrude from the support frame farther than the pads and the stacks of layers forming the piezoelectric actuator.

Forming the piezoelectric actuators may comprise: depositing, in succession, a bottom electrode layer, a piezoelectric layer and a top electrode layer on the semiconductor wafer; and for each piezoelectric actuator, forming an actuator bottom electrode, an actuator piezoelectric region and an actuator top electrode respectively from the bottom electrode layer, from the piezoelectric layer, and from the top electrode layer.

Forming the spacer structures may include, for each spacer structure, forming a dummy actuator.

Forming the dummy actuator may include forming a dummy bottom electrode, a dummy piezoelectric region and a dummy top electrode respectively from the bottom electrode layer, from the piezoelectric layer and from the top electrode layer.

The method may further include: depositing a first passivation layer on the top electrode layer; opening contact windows in the first passivation layer; depositing a routing metallization layer; forming actuator contacts in the contact windows from the routing metallization layer; and depositing a second passivation layer covering the first passivation layer and the actuator contacts.

Forming the spacer structures may comprise, for each spacer structure: forming dummy lines from the routing metallization layer on portions of the first passivation layer overlying the respective dummy actuator; and covering the dummy lines with respective portions of the second passivation layer.

The method may also include: depositing an adhesion layer on the second passivation layer and a pad metallization layer on the adhesion layer; and wherein forming the spacer structures comprises forming adhesion regions and dummy contacts on the dummy actuators, from the adhesion layer and from the pad metallization layer, respectively.

Forming the pads may comprise forming the pads from the pad metallization layer.

In an embodiment, a microelectromechanical mirror device comprises: a support frame formed of semiconductor material; a plate connected to the support frame so as to be orientable around at least one rotation axis; a micro-mirror on the plate; cantilever structures extending from the support frame and coupled to the plate so that bending of the cantilever structures causes rotations of the plate around the at least one rotation axis; piezoelectric actuators on the cantilever structures; pads on the support frame; and spacer structures protruding from the support frame more than both the pads and stacks of layers forming the piezoelectric actuators.

The spacer structures may protrude from the support frame farther than the pads and the stacks of layers forming the piezoelectric actuators.

Each spacer structure may include a dummy actuator. Each piezoelectric actuator may include an actuator bottom electrode, an actuator piezoelectric region and an actuator top electrode. Each dummy actuator may include a dummy bottom electrode, a dummy piezoelectric region and a dummy top electrode.

The device may include: a first passivation layer at least partially on the piezoelectric actuators and the dummy actuators; a second passivation layer on the first passivation layer; and connection lines between the first passivation layer and the second passivation layer. The piezoelectric actuators may include actuator contacts connected to respective connection lines through the first passivation layer, and the spacer structures may include dummy lines between portions of the first passivation layer overlying respective dummy actuators and the second passivation layer.

In a further embodiment, a picoprojector apparatus comprises: a control unit; a microelectromechanical mirror device as described above that is controlled by the control unit; and a light source that is oriented towards the microelectromechanical mirror and controlled by the control unit to generate a light beam based on an image to be generated.

An embodiment herein also comprise a portable electronic apparatus including a system processor and a picoprojector apparatus as described above that is coupled to the system processor.

BRIEF DESCRIPTION OF THE DRAWINGS

For a better understanding, some embodiments will now be described, purely by way of non-limiting example and with reference to the attached drawings, wherein.

DETAILED DESCRIPTION

Figure 1:
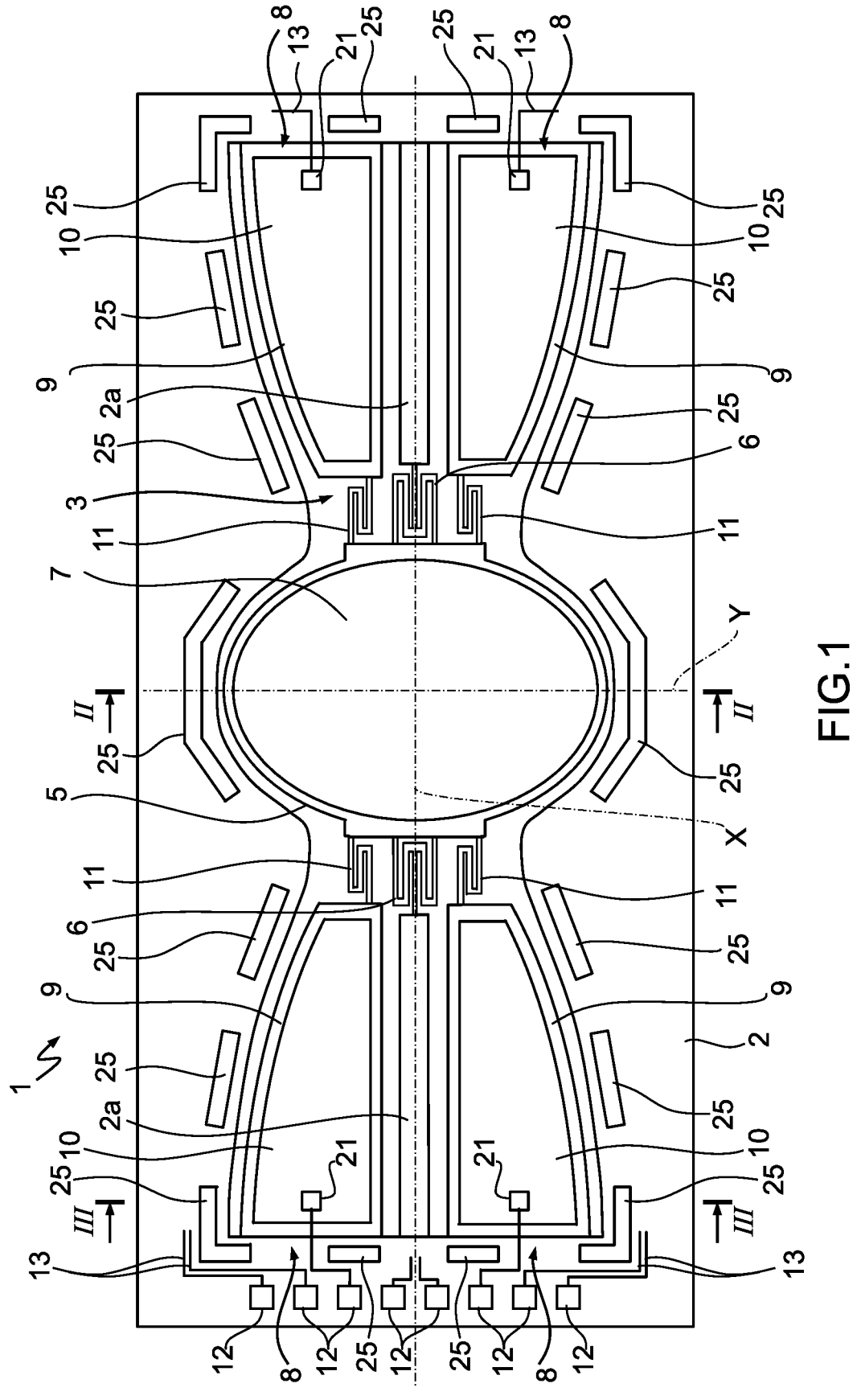
FIG. 1 is a top plan view, with parts removed, of a microelectromechanical mirror device according to an embodiment of this disclosure.
Figure 2:
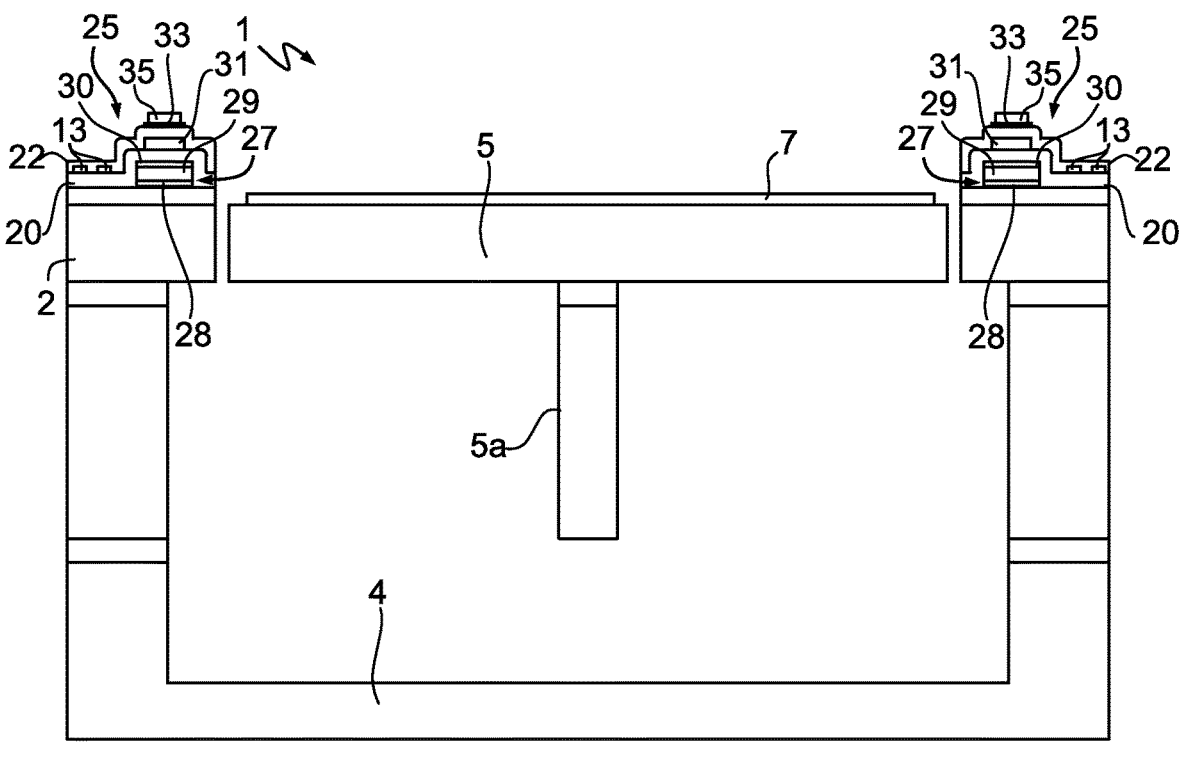
FIG. 2 is a cross-section through the microelectromechanical mirror device of FIG. 1, taken along line II-II of FIG. 1.
Figure 3:
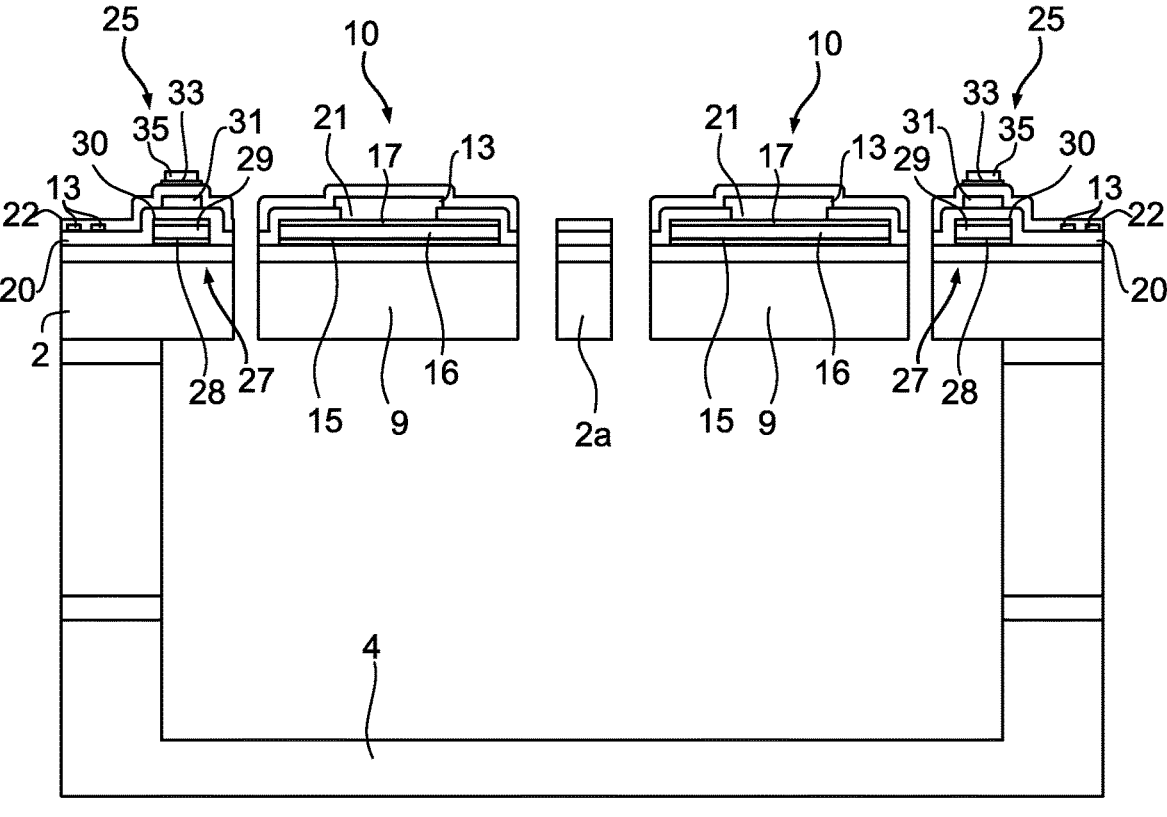
FIG. 3 is a cross-section through the microelectromechanical mirror device of FIG. 1, taken along line of FIG. 1.

With reference to FIGS. 1-3, a microelectromechanical mirror device based on microelectromechanical system (MEMS) technology and formed according to an embodiment is indicated as a whole with the reference 1. In the illustrated non-limiting example, the microelectromechanical mirror device 1 is of monoaxial type and is formed in a die of semiconductor material, in particular silicon.

The microelectromechanical mirror device 1 comprises a support frame 2, which delimits a cavity 3, and a plate 5. A cap 4 is bonded to the support frame 2 and is arranged to close the cavity 3 on a side opposite to the plate 5.

The plate 5 partially closes the cavity 3 and is connected to anchors 2a of the support frame 2 through elastic elements 6, so as to be orientable around a rotation axis X, which is also a median axis of the plate 5.

In the embodiment of FIG. 1, the plate 5 has a substantially elliptical shape and is symmetrical with respect to the rotation axis X, as well as with respect to a Y-axis perpendicular to the rotation axis X and defining, with the rotation axis X, an XY-plane parallel to the plate 5. The shape of the plate 5 is not to be construed as limiting. For example, the plate 5 might be quadrangular or polygonal with a different number of sides, or circular.

A micro-mirror 7 defined by a layer of reflecting material, for example gold or aluminum, occupies a central portion of a face of the plate 5 opposite to the cavity 3. The plate 5 is provided with a reinforcement structure 5a, for example in the form of one or more ribs, extending into the cavity 3.

The microelectromechanical mirror device 1 further comprises motion actuator assemblies 8 configured to orient the plate 5 around the rotation axes X, Y. In the embodiment of FIG. 1, there are four actuator assemblies arranged in a specular symmetrical manner in respective quadrants with respect to the center of the plate 5. In detail, the actuator assemblies extend from the support frame 2 towards the plate 5 and each motion actuator assembly 8 comprises a cantilever structure 9 and a piezoelectric actuator 10, arranged on the respective cantilever structure 9. The ends of the cantilever structures 9 are connected to the plate 5 through command elastic elements 11. Contact pads 12 are coupled to respective piezoelectric actuators 10 through connection lines 13, partially shown in FIG. 1, to apply electrical command signals. The actuator assemblies 8 are independent from each other and may be operated to orient the plate 5 with respect to the rotation axis X in a controlled manner, as explained for example in United States Patent Publication No. 2020/0192199 (corresponding to the published European Patent Application EP 3,666,727A1), the contents of which are incorporated by reference in their entirety to the maximum extent allowable under law.

In detail, each piezoelectric actuator 10 comprises a stack of layers including a bottom electrode 15, which extends on the respective cantilever structure 9, a piezoelectric region 16, for example of PZT (Lead Zirconate Titanate), and a top electrode 17. Here and below, "bottom electrode" indicates an electrode formed between the surface of the respective cantilever and the respective piezoelectric region, while "top electrode" indicates an electrode formed on the respective piezoelectric region and opposite to a corresponding bottom electrode. The bottom electrode 15 and the top electrode 17 are coupled to respective contact pads 12 on the support frame 2 through the connection lines 13. The stack of layers forming the piezoelectric actuators 10 also includes, in the following order: portions of a first passivation layer 20; portions of a routing metallization layer forming actuator contacts 21 through openings in the first passivation layer 20 and the connection lines 13; and portions of a second passivation layer 22 covering the first passivation layer 20, the actuator contacts 21 and the connection lines 13.

The microelectromechanical mirror device 1 comprises spacer structures 25 which are arranged on the support frame 2 around the cavity 3 and protrude from the surface of the support frame 2 itself more than the other structures of the microelectromechanical mirror device 1, in particular the stacks of layers of the piezoelectric actuators 10. In one embodiment, in particular, the spacer structures 25 comprise, as the stacks of layers of the piezoelectric actuators 10, a dummy actuator 27 with a dummy bottom electrode 28, a dummy piezoelectric region 29 and a dummy top electrode 30, portions of the first passivation layer 20 overlaying the dummy actuator 27, dummy lines 31 formed by respective portions of the routing metallization layer and portions of the second passivation layer 22 covering the dummy lines 31. Furthermore, the spacer structures 25 comprise, on the portions of the second passivation layer 22 covering the dummy lines 31, respective adhesion regions 33 and dummy contacts 35, formed from a metallization layer wherefrom the pads 12 are also obtained. The adhesion layers 28 and the dummy contacts 35 are prominent with respect to the other structures of the microelectromechanical mirror device 1, in particular, to the stacks of layers of the piezoelectric actuators 10. For this reason, the spacer structures 25 offer certain advantages during the manufacture of the microelectromechanical mirror device 1, as shown by the description below.

Figure 4:
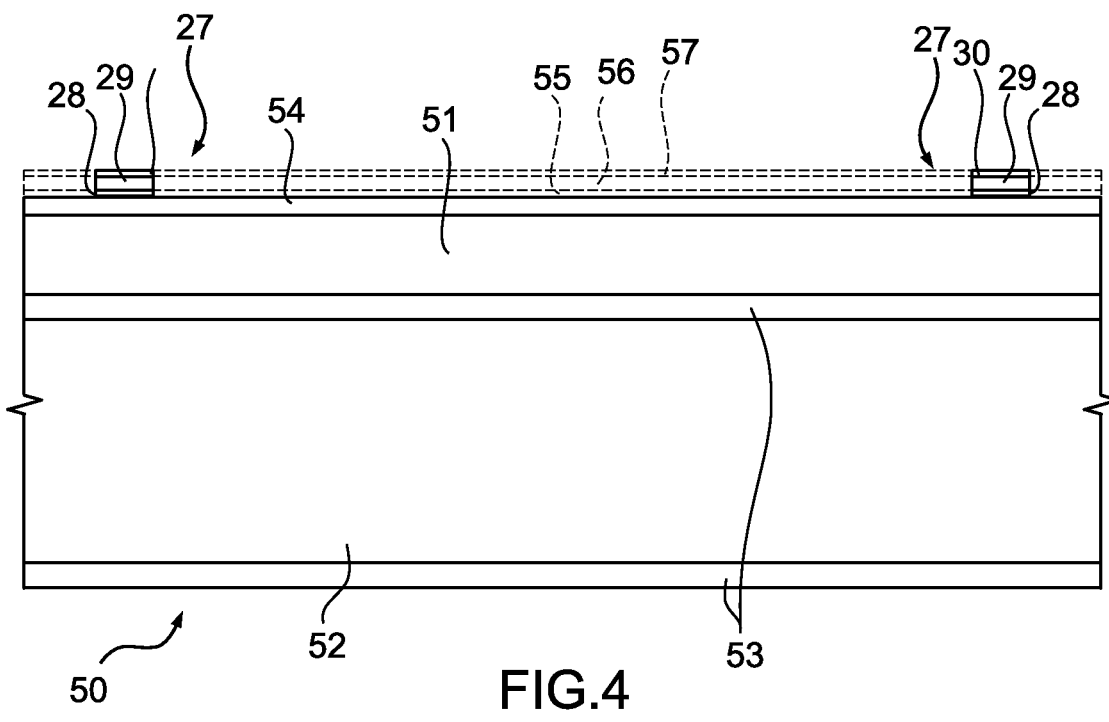
FIGS. 4, 6, 8, 10, 12 show a cross-section, corresponding to line II-II of FIG. 1, through a semiconductor wafer in successive steps of a manufacturing process according to an embodiment of this disclosure.
Figure 5:
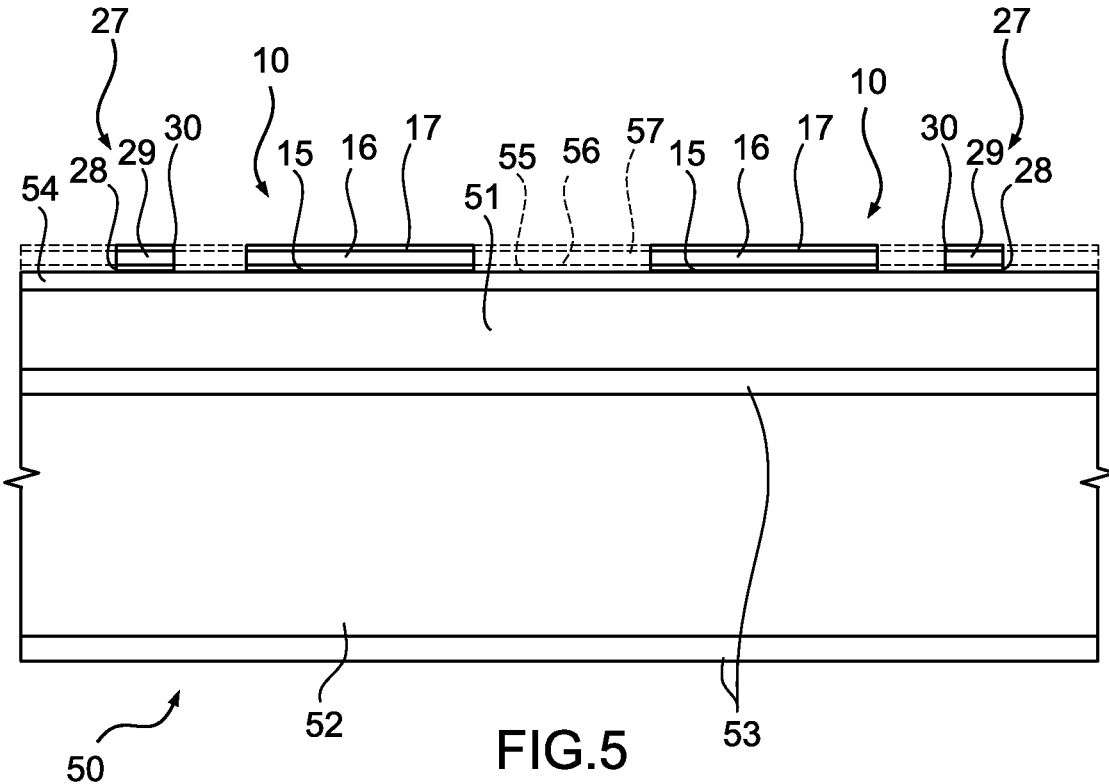
FIGS. 5, 7, 9, 11, 13 show a cross-section, corresponding to line of FIG. 1, through the semiconductor wafer of FIG. 4 in successive steps of the manufacturing process according to this disclosure.

With reference to FIGS. 4 and 5, a semiconductor wafer 50 of silicon on insulator (SOI) type comprises a first semiconductor layer 51, for example a monocrystalline epitaxial or polycrystalline pseudo-epitaxial layer, and a second semiconductor layer 52, for example a monocrystalline substrate. The first semiconductor layer 51 and the second semiconductor layer 52 are separated by a dielectric layer 53, which also extends on a face of the second semiconductor layer 52 opposite to the first semiconductor layer 51. A thermal-oxide layer 54 is initially grown on the first semiconductor layer 54, then a bottom electrode layer 55, a piezoelectric layer 56 and a top electrode layer 57 are deposited in succession and defined. Residual portions of the stack formed by the bottom electrode layer 55, the piezoelectric layer 56 and the top electrode layer 57 define the piezoelectric actuators 10 (the bottom electrode 15, the piezoelectric region 16 and the top electrode 17, respectively) and the dummy actuators 27 (the bottom electrode 28, the piezoelectric region 29 and the top electrode 30, respectively).

Figure 6:
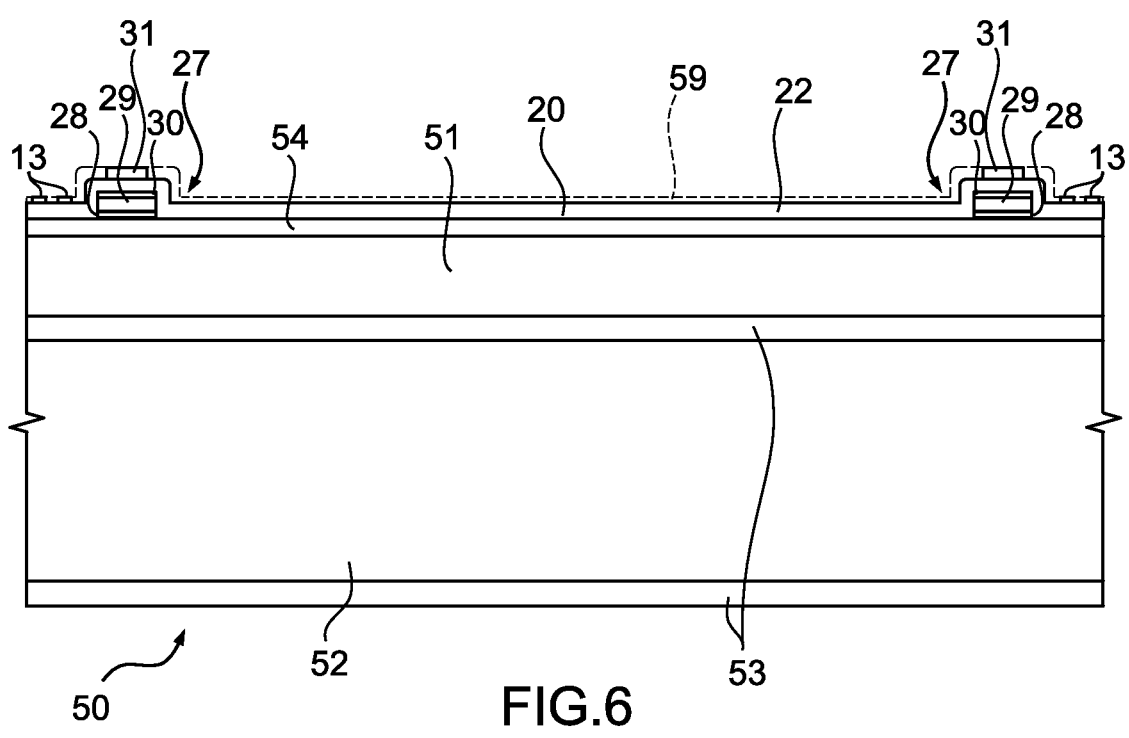
Figure 7:
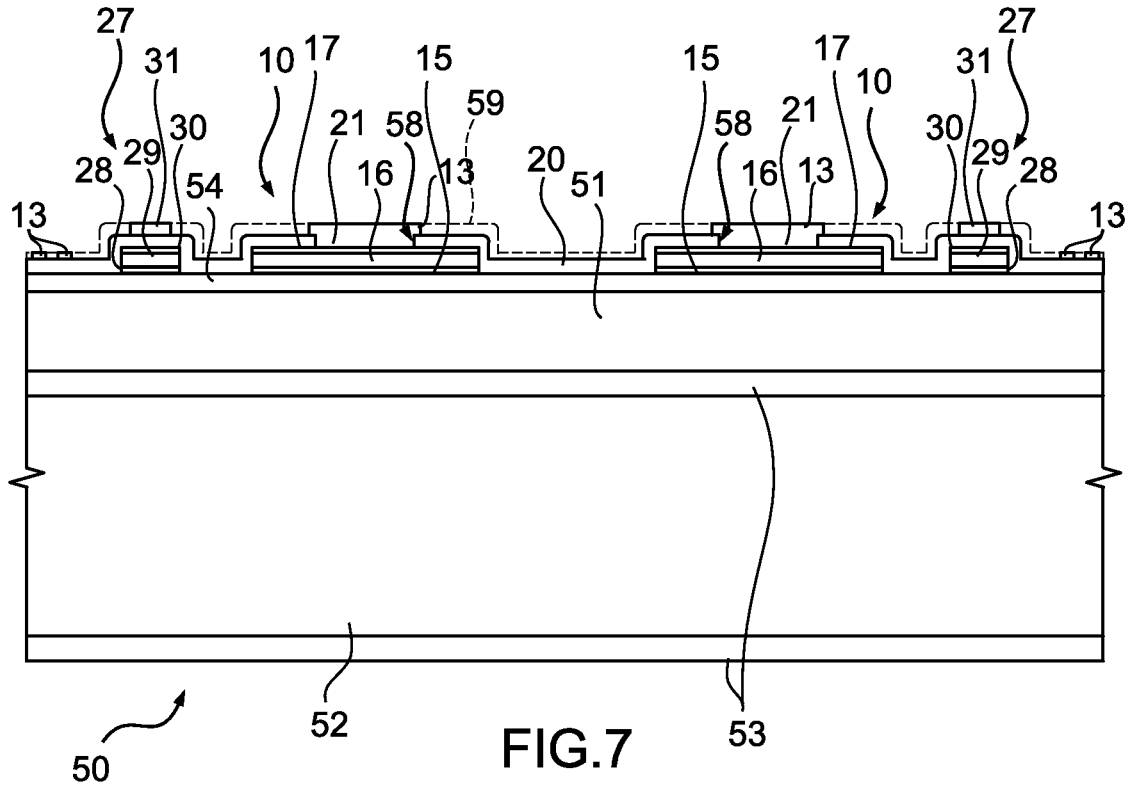

Subsequently (referring now to FIGS. 6 and 7), the first passivation layer 20 is deposited and contact windows 58 are opened on the piezoelectric actuators 10. The routing metallization layer, here indicated with the number 59, is deposited and shaped to form the connection lines 13, the actuator contacts 21 in the contact windows 58 and the dummy lines 31 on the dummy actuators 27.

Figure 8:
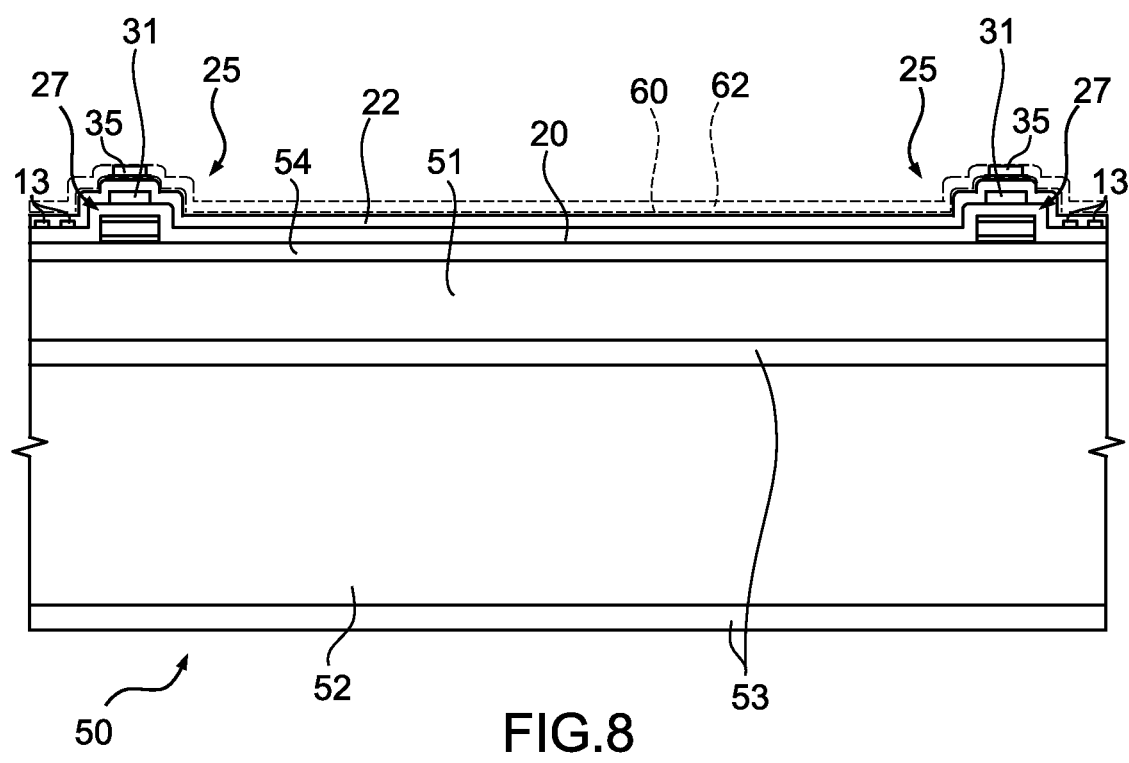
Figure 9:
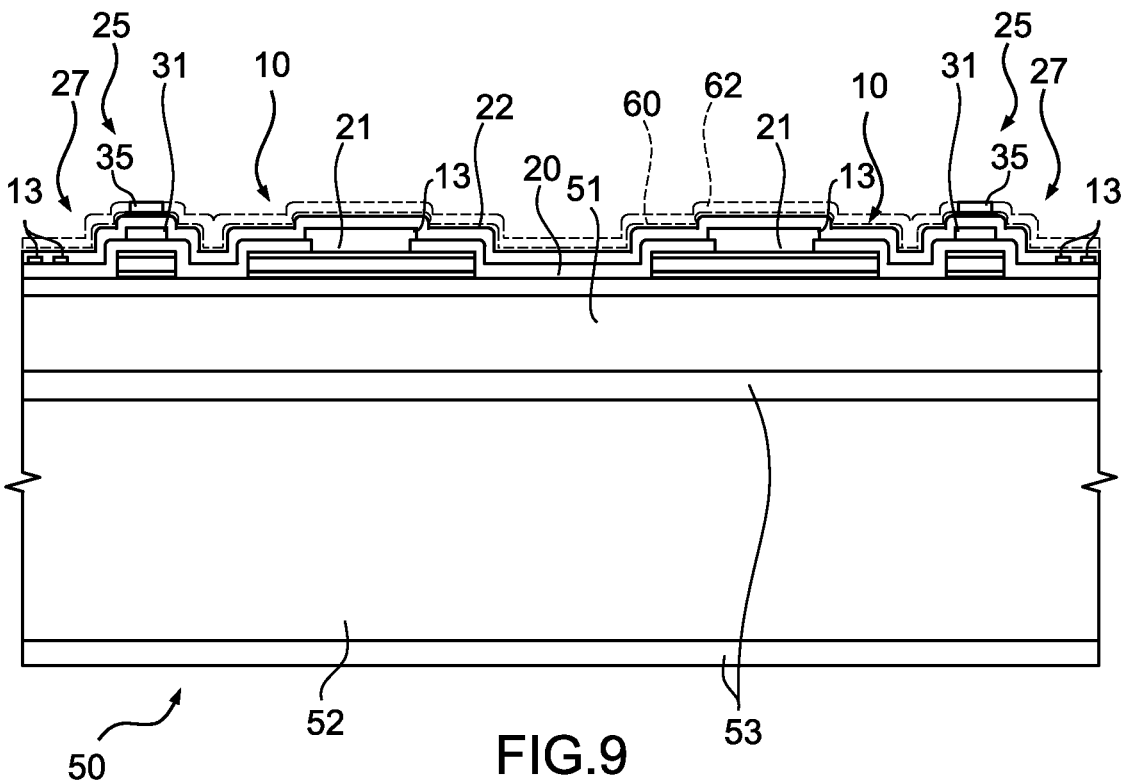

With reference to FIGS. 8 and 9, the second passivation layer 22 is deposited and covers the connection lines 13, the actuator contacts 21 and the dummy lines 31. Then, an adhesion layer 60 and a pad metallization layer 62 are deposited and shaped to form the adhesion regions 33, the pads 12 (not visible in FIGS. 8 and 9; see FIG. 1), the connection lines 13 and the dummy contacts 35. In particular, the dummy contacts are formed on top of the dummy actuators 27. The spacer structures 25 are thus completed. The spacer structures 25 protrude from the surface of the support frame 2 more than both the pads 12, which are formed on the routing metallization layer, but without the interposition of piezoelectric material, and the stacks of the piezoelectric actuators 10, where the dummy contacts are absent.

Figure 10:
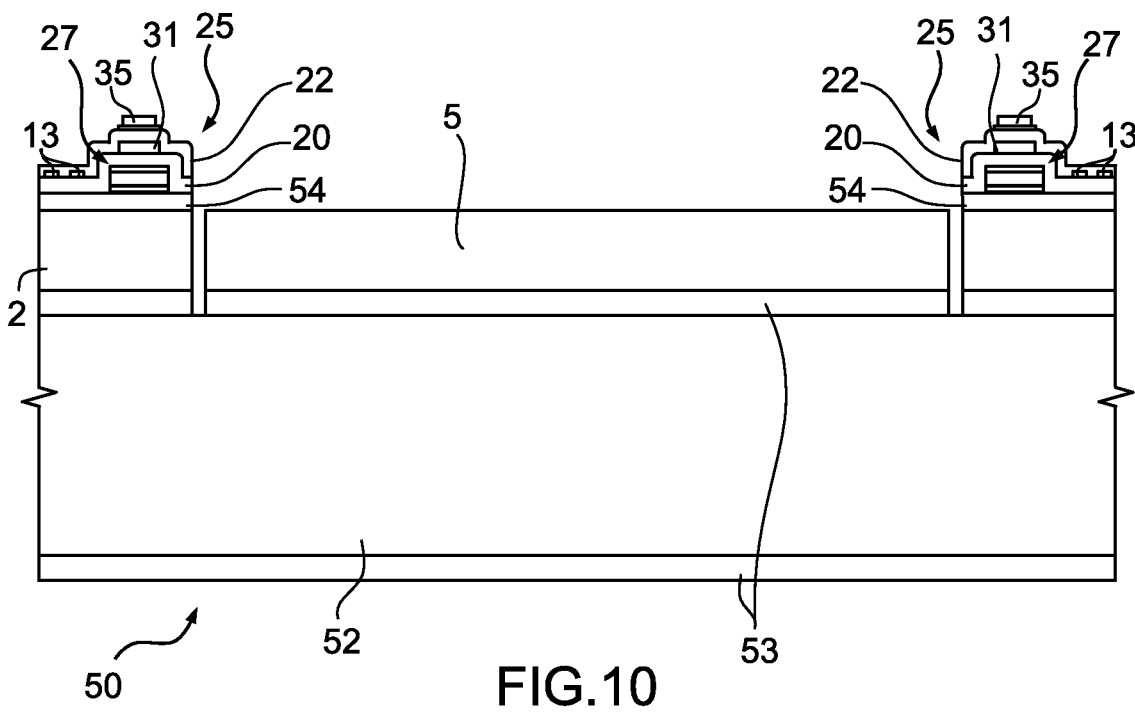
Figure 11:
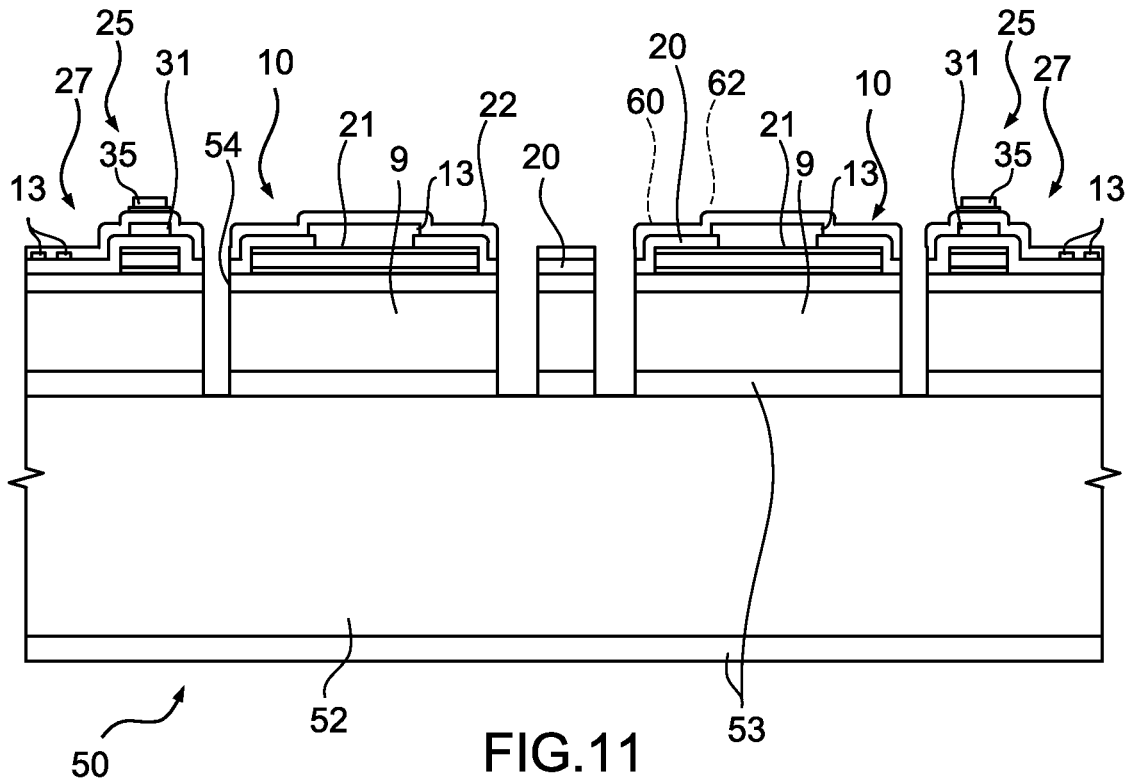

As shown in FIGS. 10 and 11, the passivation layers 20, 22, the thermal-oxide layer 54, the first semiconductor layer 51 and the dielectric layer 53 (between the first semiconductor layer 51 and the second semiconductor layer 52) are anisotropically etched and a portion of the support frame 2, the plate 5 and the anchors 2a are defined. In this step, the passivation layers 20, 22 and the thermal-oxide layer 54 are also removed on the portion of the first semiconductor layer 51 intended to form the plate 5.

Figure 12:
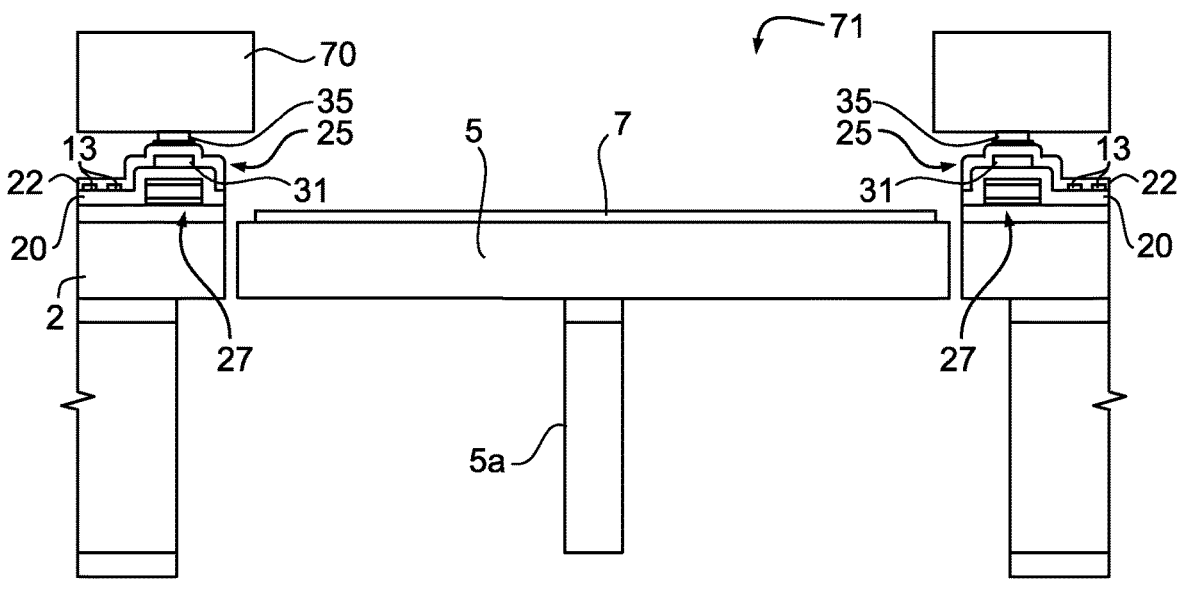
Figure 13:
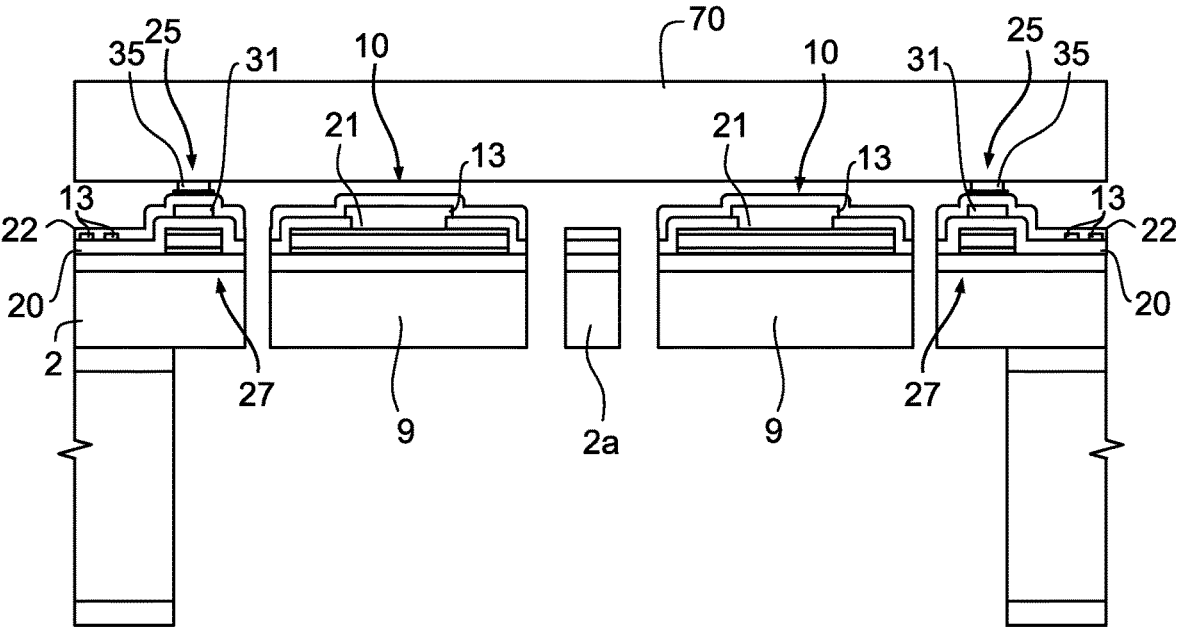

At this point (FIGS. 12 and 13), a shadow mask 70 is defined and applied to the semiconductor wafer 1 on the side of the plate 5. The shadow mask 70 in practice rests on the spacer structures 25, which protrude more than the other structures present on the semiconductor wafer 1, and above all it does not come into contact with electrical connection structures and with the piezoelectric actuators 10. The shadow mask 70 has an opening 71 in a position corresponding to the plate 5. The micro-mirror 7 is then formed through the opening 71 of the shadow mask 70 for example by deposition of aluminum or gold by sputtering. The shadow mask 70 is then removed. Finally, the cap 4 is joined to the support frame 2 to close the cavity 3 on the back of the semiconductor wafer 1, which is then diced to obtain copies of the microelectromechanical device 1 of FIGS. 1 and 3.

The use of the spacer structures 25 is particularly advantageous since the microelectromechanical mirror device 1 is protected when the shadow mask 70 is applied and removed. During this step, the spacer structures 25, which are in contact with the shadow mask 70, may be damaged, whereas the other structures are not exposed to risks. On the other hand, the spacer structures 25 are not functional to the use of the microelectromechanical mirror device 1 and therefore damage or even the complete destruction thereof are totally irrelevant. The parts used for operation are instead safeguarded and therefore the application and the removal of the shadow mask 70, which might normally cause a high percentage of reject, do not entail significant risks. The overall yield of the process is therefore high.

A further advantage results from the fact that the spacer structures 25 include the same sequence of layers as the piezoelectric actuators and, in addition, a portion of the metallization layer used for the pads 12. On the one hand, in fact, the sequence of the layers helps ensure that the spacer structures 25 protrude from the support frame 2 more than the other structures of the microelectromechanical mirror device 1, in particular more than the piezoelectric actuators 10. On the other hand, the manufacture of the spacer structures 25 does not utilize additional process step and therefore does not affect the production costs. The layers that form the spacer structures 25 are used for other structures of the microelectromechanical mirror device 1 and may be shaped in the same process steps and with the same suitably designed masks with which the other structures are defined.

Figure 14:
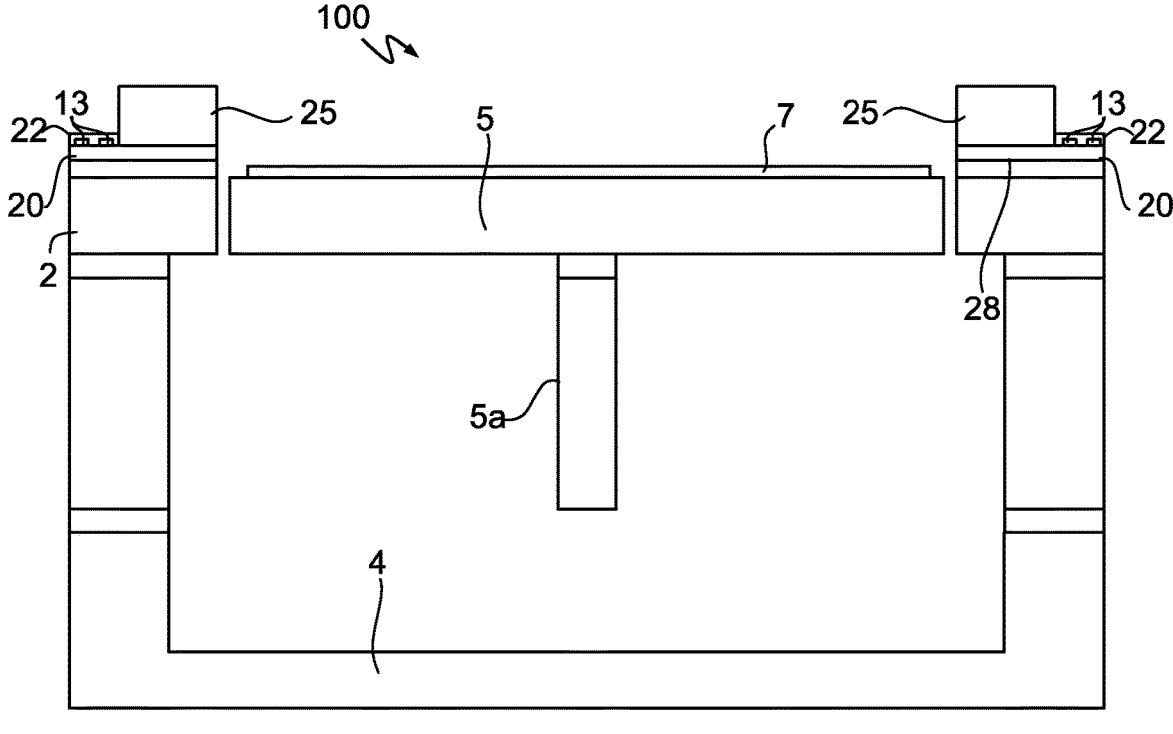
FIG. 14 is a first cross-section through a microelectromechanical mirror device in a different embodiment of this disclosure.
Figure 15:
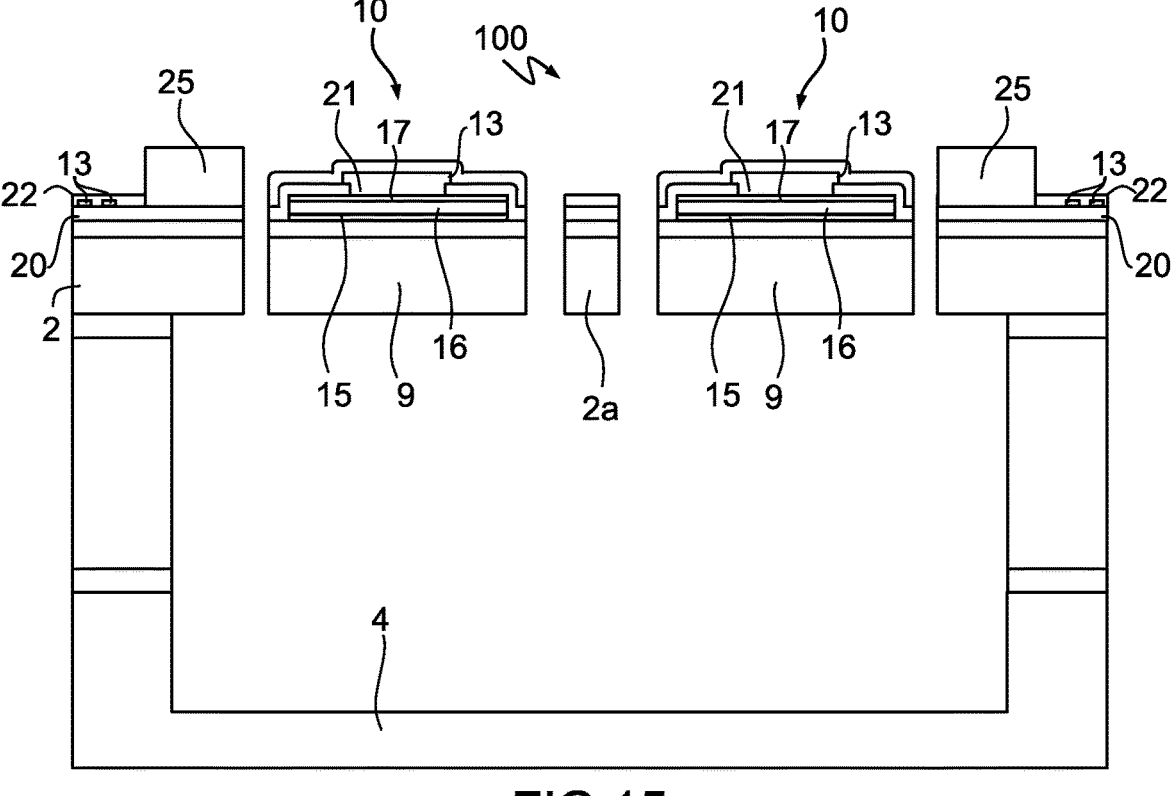
FIG. 15 is a second cross-section through the microelectromechanical mirror device of FIG. 12.

Although this is particularly advantageous, however, it is not essential that the spacer structures are formed from the same layers wherefrom the other structures of the microelectromechanical mirror device 1 are obtained. For example, the spacer structures might be made in whole or in part of other materials, for example including parts of polymeric materials, as shown in FIG. 14, where parts equal to those already shown are indicated with the same reference numbers. In this case, a microelectromechanical mirror device 100 comprises spacer structures 125 of polymeric material which define the maximum protrusions with respect to the support frame 2.

Figures 16, 17:
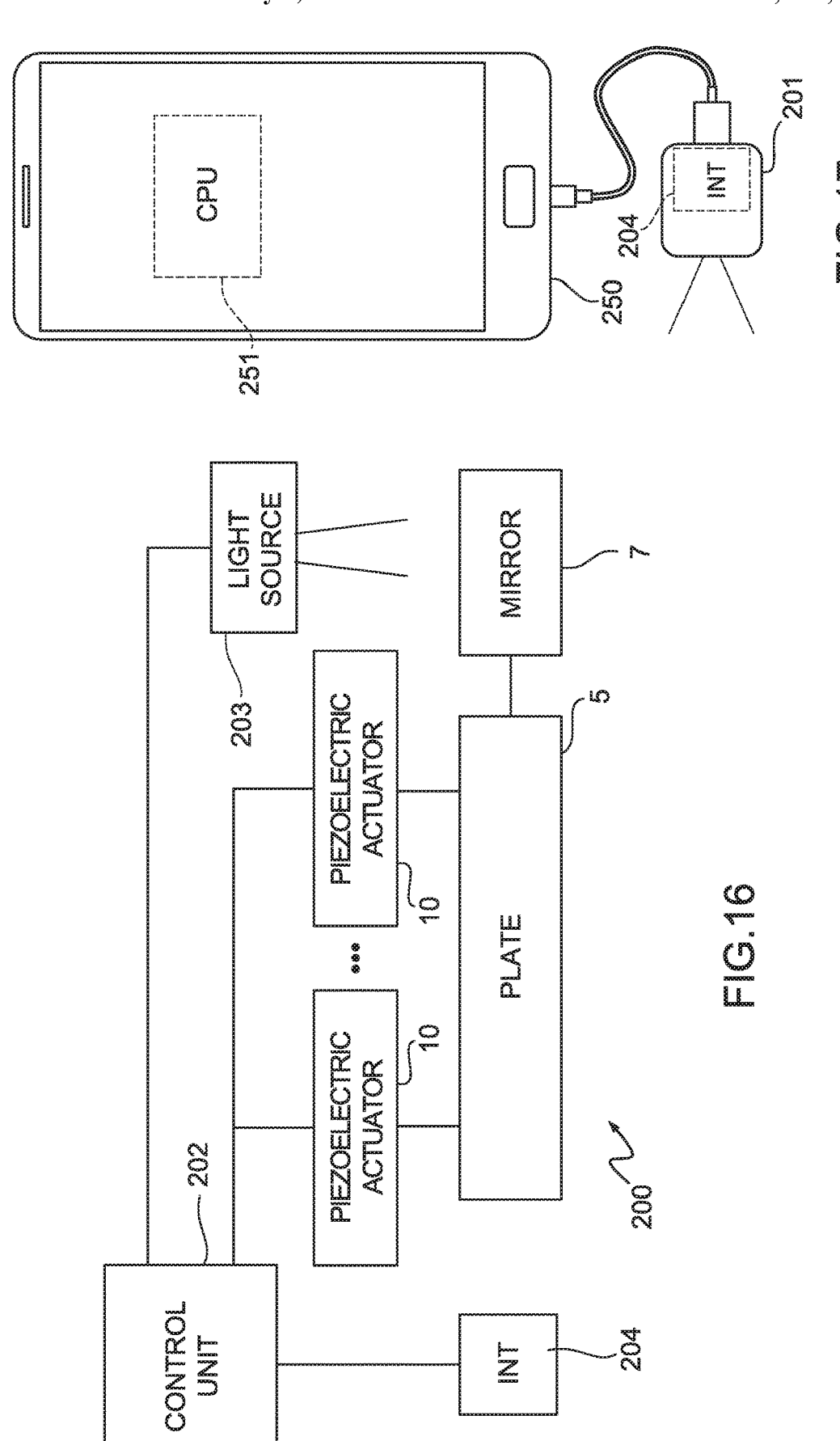
FIG. 16 is a simplified block diagram of a picoprojector device incorporating a microelectromechanical mirror device according to an embodiment of this disclosure.
FIG. 17 is a schematic view of a portable electronic device using the picoprojector device of FIG. 16.

FIG. 16 illustrates a picoprojector device 200 which comprises the microelectromechanical mirror device 1, a control unit 202, a light source 203 and an interface 204 for the connection to an electronic apparatus, such as a desktop or portable computer, a tablet or a mobile phone.

The control unit 201 controls, on the basis of an image to be projected, a light beam emitted by the light source 203 and the orientation of the plate 5 so as to coordinate the projection of a sequence of image points and a two-dimensional scanning procedure of an image area.

FIG. 17 illustrates an electronic apparatus 250, in particular a mobile phone, coupled to the picoprojector device 200 through the interface 204. The electronic apparatus 250 is provided with a system processor 251 which provides the picoprojector device 200 with an image signal, for example a file in a standard image format.

In one embodiment, the picoprojector device may be integrated into the portable apparatus.

Finally, it is apparent that modifications and variations may be made to the described process and device, without departing from the scope of this disclosure.

In particular, the microelectromechanical mirror device may be of biaxial type. Furthermore, the shape of the plate and the micro-mirror may be freely defined according to the design preferences. For example, the plate and the micro-mirror may be circular, quadrangular or more generally polygonal. Furthermore, the micro-mirror may not have the same shape as the plate.

As for the process, the micro-mirror may be formed on the plate through the shadow mask after the etching of the second semiconductor layer.

The invention claimed is:

1. A microelectromechanical mirror device, comprising:
a support frame formed of semiconductor material;
a plate connected to the support frame so as to be orientable around at least one rotation axis;
a micro-mirror on the plate;
cantilever structures extending from the support frame and coupled to the plate so that bending of the cantilever structures causes rotation of the plate around the at least one rotation axis;
piezoelectric actuators on the cantilever structures;
pads on the support frame; and
spacer structures protruding from the support frame more than both the pads and stacks of layers forming the piezoelectric actuator;
wherein the spacer structures comprise a dummy actuator having a dummy bottom electrode, a dummy piezoelectric region and a dummy top electrode, portions of a first passivation layer overlaying the dummy actuator, dummy lines formed by respective portions of a routing metallization layer, and portions of a second passivation layer covering the dummy lines, and wherein the spacer structures further comprise, on the portions of the second passivation layer covering the dummy lines, adhesion regions and dummy contacts formed from a metallization layer.

2. The device according to claim 1, wherein the spacer structures protrude from the support frame farther than the pads and the stacks of layers forming the piezoelectric actuators.

3. The device according to claim 1, wherein:
each piezoelectric actuator comprises an actuator bottom electrode, an actuator piezoelectric region and an actuator top electrode.

4. The device according to claim 3:
wherein the first passivation layer is at least partially overlaying the piezoelectric actuators and the dummy actuators; and
further comprising connection lines between the first passivation layer and the second passivation layer; and
wherein the piezoelectric actuators comprise actuator contacts connected to respective connection lines through the first passivation layer.

5. A picoprojector apparatus, comprising:
a control unit;
the microelectromechanical mirror device according to claim 1, controlled by the control unit; and
a light source, oriented towards the microelectromechanical mirror and controlled by the control unit to generate a light beam based on an image to be generated.

6. A portable electronic apparatus comprising a system processor and the picoprojector apparatus according to claim 5 coupled to the system processor.

7. The device according to claim 1, wherein the plate includes a reinforcement structure comprising at least one rib extending into a cavity delimited by the support frame.

8. The device according to claim 1, further comprising a cap bonded to the support frame, wherein the cap and the support frame define a cavity enclosing at least a portion of the plate.

9. The device according to claim 1, wherein the cantilever structures are arranged symmetrically with respect to a center of the plate in respective quadrants.

10. A microelectromechanical scanning device, comprising:
a semiconductor support structure defining a cavity;
a movable plate partially closing the cavity and connected to the semiconductor support structure through elastic elements;
a reflective element disposed on the movable plate;
a plurality of actuator assemblies extending from the semiconductor support structure toward the movable plate, each actuator assembly comprising:
a cantilever arm having a fixed end coupled to the semiconductor support structure and a free end coupled to the movable plate; and
a piezoelectric stack on the cantilever arm;
electrical contact pads disposed on the semiconductor support structure and electrically coupled to the piezoelectric stacks; and
protective spacer elements disposed on the semiconductor support structure and protruding farther from a surface of the semiconductor support structure than both the electrical contact pads and the piezoelectric stacks:
wherein the protective spacer elements comprise a dummy actuator having a dummy bottom electrode, a dummy piezoelectric region and a dummy top electrode, portions of a first passivation layer overlaying the dummy actuator, dummy lines formed by respective portions of a routing metallization layer, and portions of a second passivation layer covering the dummy lines, and wherein the protective spacer elements further comprise, on the portions of the second passivation layer covering the dummy lines, adhesion regions and dummy contacts formed from a metallization layer.

11. The device of claim 10, wherein the protective spacer elements further comprise polymeric material.

12. The device of claim 10, wherein:
the movable plate is orientable around at least one rotation axis; and
the plurality of actuator assemblies are arranged symmetrically with respect to the at least one rotation axis.

13. The device of claim 10, further comprising a cap bonded to the semiconductor support structure and arranged to close the cavity on a side opposite to the movable plate.

14. The device of claim 10, wherein the movable plate includes a reinforcement structure extending into the cavity.

15. The device of claim 10, wherein the plurality of actuator assemblies are independently controllable to orient the movable plate in multiple directions.

* * * * *